United States Patent
Maeda et al.

(10) Patent No.: US 7,377,053 B1
(45) Date of Patent: May 27, 2008

(54) METHOD AND DEVICE FOR DRYING SUBSTRATE

(75) Inventors: Norio Maeda, Yamatokouriyama (JP); Koji Sumi, Yamatokouriyama (JP); Hiroshi Aihara, Sakai (JP); Masao Oono, Sakai (JP); Takao Matsumoto, Saki (JP); Naoaki Izutani, Sakai (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 09/936,618

(22) PCT Filed: Jan. 17, 2000

(86) PCT No.: PCT/JP00/00175

§ 371 (c)(1),
(2), (4) Date: Mar. 5, 2002

(87) PCT Pub. No.: WO01/53766

PCT Pub. Date: Jul. 26, 2001

(51) Int. Cl.
  F26B 21/00 (2006.01)
  F26B 21/06 (2006.01)
  F26B 21/12 (2006.01)
  B08B 3/02 (2006.01)
  B08B 3/04 (2006.01)
  B08B 5/00 (2006.01)

(52) U.S. Cl. .................. 34/445; 34/487; 34/410; 134/21; 134/95.3; 134/902

(58) Field of Classification Search .......... 34/445, 34/467, 74, 78, 92, 406, 409, 410, 443, 487; 134/11, 30, 31, 95.1, 902, 21, 26, 32, 37, 134/95.2, 95.3, 147

See application file for complete search history.

(56) References Cited

U.S. PATENT DOCUMENTS

| 4,816,081 | A | * | 3/1989 | Mehta et al. .................. 134/30 |
| 5,653,045 | A | | 8/1997 | Ferrell |
| 5,685,086 | A | | 11/1997 | Ferrell |
| 5,772,784 | A | * | 6/1998 | Mohindra et al. ............ 134/21 |
| 5,782,990 | A | | 7/1998 | Murakami et al. |
| 5,951,779 | A | * | 9/1999 | Koyanagi et al. ............... 134/2 |
| 5,954,911 | A | * | 9/1999 | Bergman et al. ........ 156/345.29 |
| 5,964,958 | A | | 10/1999 | Ferrell et al. |
| 5,968,285 | A | | 10/1999 | Ferrell et al. |
| 6,123,900 | A | * | 9/2000 | Vellutato ...................... 422/22 |
| 6,152,153 | A | * | 11/2000 | Takase et al. .............. 134/25.1 |
| 6,216,709 | B1 | * | 4/2001 | Fung et al. ................. 134/25.4 |
| 6,219,936 | B1 | * | 4/2001 | Kedo et al. .................... 34/381 |

(Continued)

FOREIGN PATENT DOCUMENTS

JP     59156995   A   *   9/1984

(Continued)

Primary Examiner—Jiping Lu
(74) Attorney, Agent, or Firm—Global IP Counselors

(57) ABSTRACT

A device for drying substrate comprising a processing vessel housing a specified number of substrates such as semiconductor wafers installed erectedly in parallel to one another, a first substrate supporting member supporting substrates within the processing vessel, the processing fluid supplying section supplying to the processing vessel, the processing fluid for performing processing such as cleaning processing on the substrates, a processing fluid exhausting section exhausting processing fluid from the processing vessel, and a drying fluid supplying section supplying, to the processing vessel, the liquid drops of drying fluid for performing drying processing on the substrates.

17 Claims, 11 Drawing Sheets

U.S. PATENT DOCUMENTS 6,247,479 B1 * 6/2001 Taniyama et al. .......... 134/95.2
6,412,501 B1 * 7/2002 Onoda et al. .............. 134/95.2
6,491,045 B2 * 12/2002 Kamikawa et al. ...... 134/102.3

FOREIGN PATENT DOCUMENTS

| | | |
|---|---|---|
| JP | 6-103686 B2 | 12/1994 |
| JP | 409213672 A * | 8/1997 |
| JP | 10-189517 A | 7/1998 |
| JP | 10-335299 | 12/1998 |
| JP | 11-176796 | 7/1999 |
| JP | 11-345798 | 12/1999 |
| JP | 2000-12505 | 1/2000 |

* cited by examiner

METHOD AND DEVICE FOR DRYING SUBSTRATE

TECHNICAL FIELD

The present invention relates to a method and device for drying substrates. More particularly, the present invention relates to a method and device for rapidly drying substrates which are cleaned using cleaning fluid.

RELATED ART

From the past, a device having an arrangement which is illustrated in Japanese Patent Publication Gazette No. Hei 6-103686, U.S. Pat. No. 5,964,958 and others is proposed as a device for drying substrates (for example, semiconductor wafer or the like) after cleaning of the substrates using cleaning fluid, by relatively lowering the fluid face of the cleaning fluid with respect to the substrates and by supplying drying fluid vapor {for example, isopropyl alcohol (hereinafter referred to as IPA) vapor or the like}.

When the device is employed, a plurality of substrate housed within a processing vessel is cleaned using the cleaning fluid, then the drying fluid vapor is introduced within the processing vessel and the fluid face of the cleaning fluid is lowered, both operations are carried out simultaneously, so that a thin fluid layer of drying fluid is generated on the fluid face of the cleaning fluid. Consequently, the surface of each substrate is rapidly dried using MARANGONI effect.

When the device having the arrangement illustrated in Japanese Patent Publication Gazette No. Hei 6-103686 is employed, not only an introducing passage for introducing drying vapor but also a relief valve (exhaust opening) for exhausting drying vapor are needed for forming a flowing passage of drying vapor within the processing vessel so that the arrangement becomes complicated and that a dangerous condition is realized in which the drying vapor leak within a factory.

Further, when the device is applied for drying a plurality of semiconductor wafer, the semiconductor wafer is enlarged in size, and an interval of semiconductor wafer is decreased for increasing a number of semiconductor wafer which are processed simultaneously, in recent years. Under such condition, a disadvantage arises in that intruding of the drying vapor between semiconductor wafers becomes difficult so as to generate a drying mark on the semiconductor wafers.

Furthermore, when each substrate such as a semiconductor wafer has a pattern having a thickness to some degree, the thickness of the fluid layer of drying fluid should be increased to some degree for sufficiently and rapidly drying within inner section (concave section) of the pattern. But, it is difficult to increase the thickness of the fluid layer of drying fluid sufficiently in the entire surface of the substrates. Therefore, the inner section of the pattern cannot be dried sufficiently so that cleaning fluid remains on the surface of the substrates. In other words, the device cannot deal sufficiently for the substrates having a higher aspect ratio.

The present invention was made in view of the above problems.

It is an object of the present invention to offer a method and device for drying substrate in which an exhaust equipment is eliminated or simplified and for smoothly supplying drying fluid and for sufficiently increasing a thickness of a fluid layer of drying fluid.

DISCLOSURE OF THE INVENTION

A method for drying substrate houses substrates within a processing vessel, and dries a surface of each substrate by relatively lowering a fluid face of cleaning fluid within a processing vessel with respect to the substrates and by introducing the cleaning fluid within the processing vessel, the method comprises the steps of, introducing drying fluid under a liquid condition within the processing vessel, and forming liquid drops of drying fluid and supplying the liquid drops onto the fluid face of the cleaning fluid using a nozzle.

The liquid drops preferably have a diameter which is greater than 100 µm and equal to or less than 1 mm. The liquid drops more preferably have a diameter which is greater than 100 µm and equal to or less than 200 µm.

The method for drying substrate can house the substrates within the processing vessel in an inclined condition by a predetermined angle, and supply the liquid drops of drying fluid using the nozzle in a direction which is the same direction of the inclined substrates.

The inclination angle is preferably greater than 0° and equal to or less than 30°. The inclination angle is more preferably equal to or greater than 3° and equal to or less than 5°.

The method for drying substrate can determine an introduction direction of the drying fluid into the processing vessel and determine an introduction initial speed of the drying fluid so as to expand the drying fluid up to the entire width of the substrates on the fluid surface of the cleaning fluid.

The introduction initial speed is preferably equal to or greater than 10 m/sec and equal to or less than 330 m/sec. The introduction initial speed is more preferably equal to or greater than 50 m/sec and equal to or less than 150 m/sec.

The method for drying substrate can supply inert gas into the processing vessel during exhausting of the cleaning fluid from the processing vessel.

The method for drying substrate can increase the supplying quantity of the drying fluid and/or the inert gas into the processing vessel during exhausting of the cleaning fluid from the processing vessel.

The method for drying substrate can change a supporting position of the substrates during exhausting of the cleaning fluid from the processing vessel.

The method for drying substrate can make the interior of the processing vessel to be inert gas environment prior to exhausting of cleaning fluid from the processing vessel.

The method for drying substrate can carry out the cleaning process and the following drying processing under a room temperature.

The method for drying substrate can flow the drying fluid by the pressure of inert gas which is supplied to the nozzle.

A device for drying substrate supports substrates within a processing vessel by supporting means, and dries a surface of each substrate by relatively lowering a fluid face of cleaning fluid within a processing vessel with respect to the substrates and by introducing drying fluid within the processing vessel, the device compromises, drying fluid supplying means for introducing drying fluid under a liquid condition within the processing vessel, for forming liquid drops of drying fluid using a nozzle, and for supplying the liquid drops of drying fluid onto the fluid face of the cleaning fluid using a nozzle.

The liquid drops preferably have a diameter which is greater than 100 µm and equal to or less than 1 mm. The liquid drops more preferably have a diameter which is greater than 100 µm and equal to or less than 200 µm.

In the device for drying substrate, the supporting means can be means for supporting the substrates within the processing vessel in an inclined condition by a predetermined angle, and the nozzle can be a nozzle for supplying the liquid drops of drying fluid using the nozzle in a direction which is the same direction of the inclined substrates.

The inclination angle is preferably greater than 0° and equal to or less than 30°. The inclination angle is more preferably equal to or greater than 3° and equal to or less than 5°.

In the device for drying substrate, the drying fluid supplying means can be a means for determining an introduction direction of the drying fluid into the processing vessel and determining an introduction initial speed of the drying fluid so as to expand the drying fluid up to the entire width of the substrates on the fluid surface of the cleaning fluid.

The introduction initial speed is preferably equal to or greater than 10 m/sec and equal to or less than 330 m/sec. The introduction initial speed is more preferably equal to or greater than 50 m/sec and equal to or less than 150 m/sec.

The device for drying substrate can further comprise inert gas supplying means for supplying inert gas into the processing vessel during exhausting of the cleaning fluid from the processing vessel.

The device for drying substrate can further comprise supplying quantity control means for increasing the supplying quantity of the drying fluid and/or the inert gas into the processing vessel during exhausting of the cleaning fluid from the processing vessel.

In the device for drying substrate, the supporting means can be a means having a cleaning fluid introduction groove which follows in a lower ward direction with respect to the substrate supporting section.

In the device for drying substrate, the supporting means can be a pair of supporting means for selectively supporting different positions of the substrates which positions are different from one another, and further comprise supporting position control means for changing the supporting position of the substrates by the supporting means during exhausting of the cleaning fluid from the processing vessel.

The device for drying substrate can further comprise environment determination means for making the interior of the processing vessel to be inert gas environment prior to exhausting of the cleaning fluid from the processing vessel.

The device for drying substrate can further comprise nozzle position control means for moving the nozzle towards the substrate during exhausting of the cleaning fluid from the processing vessel.

The moveable extent of the nozzle by the nozzle position control means is preferably greater than 0 mm and equal to or less than 500 mm. The moveable extent is more preferably equal to or greater than 250 mm and equal to or less than 350 mm.

The device for drying substrate can further comprise circulation means for circulating the drying fluid when ejection is not carried out.

In the device for drying substrate, a number of nozzles can be determined in response to response to the size of the substrate and the pitch of the substrates.

In the device for drying substrate, the nozzle can have drying fluid ejection holes a number of which is greater than the number of the substrates by 1 which substrates are dried simultaneously.

The device for drying substrate can further comprise inert gas supplying means for supplying inert gas to the nozzle so as to flow the drying fluid by the pressure of inert gas.

When the method for drying substrate is employed, the method can house substrates within the processing vessel, and dry the surface of each substrate by relatively lowering the fluid face of cleaning fluid within the processing vessel with respect to the substrate and by introducing the drying fluid within the processing vessel.

During this operation, the method forms liquid drops of drying fluid using the nozzle, supplies the liquid drops of drying fluid onto the fluid face of the cleaning fluid using a nozzle. Therefore, the liquid drops of drying fluid is smoothly introduced between the substrates due to the influence of dead weight of the liquid conditioned drying fluid so that the drying fluid with high density with respect to the density of the vapor supplying so as to improve MARANGONI effect. Consequently, a liquid layer of the drying fluid having a sufficient thickness is generated on the cleaning fluid so that drying of the substrates with greatly little drying mark is rapidly realized using MARANGONI effect. Further, the thickness of the fluid layer of the drying fluid can be determined to be sufficiently great so that securely drying is performed up to the inner section (concave section) of a pattern even when the substrate has the pattern. Consequently, the method can deal with the high aspect ratio substrates and securely prevents the cleaning fluid from remaining on the surface of the substrates. Further, the drying fluid is supplied in a liquid drop condition, so that the entirety or almost of the drying fluid is discharged with the cleaning fluid. Consequently, leakage of the drying fluid is decreased up to nearly zero so that exhaust equipment is eliminated or is simplified. As a result, decrease in cost is realized.

In this case, when the liquid drop of drying fluid has a diameter which is greater than 100 μm and equal to or less than 1 mm, the above operation is realized following the supplying of the liquid drops. The liquid drop is more preferable to have a diameter which is greater than 100 μm and equal to or less than 200 μm. Disadvantages are prevented from occurrence such that the substrates are dried insufficiently due to shortage of supplying quantity of the drying fluid, that the cleaning fluid jumps so that the cleaning fluid is adhered to the substrates, and that the running cost is increased due to the increase of the drying fluid.

When the method for drying substrate is employed, the method can house the substrates within the processing vessel in an inclined condition by a predetermined angle, and supply the liquid drops of drying fluid using the nozzle in a direction which is the same direction of the inclined substrates. Therefore, when each substrate has a pattern on one face and when the pattern formed face of a plurality of substrates are positioned in the same side, exhausting of the cleaning fluid is easily performed which is introduced within the inner section of the pattern so that more rapid and better drying is realized.

In this case, when the inclination angle is greater than 0° and equal to or less than 30°, the above operation is realized. The inclination angle is more preferable to be equal to or greater than 3° and equal to or less than 5°. Disadvantages are prevented from occurrence such that the cleaning fluid within the inner section of the pattern is difficult to be exhausted, that the drying fluid is difficult to be supplied to the dipping boundary face, and that the cleaning fluid exhausted from the pattern drops onto the neighboring substrate. In addition, the above operation is realized.

When the method for drying substrate is employed, the method can determine an introduction direction of the drying fluid into the processing vessel and determine an introduction initial speed of the drying fluid so as to expand the drying fluid up to the entire width of the substrates on the fluid surface of the cleaning fluid. Therefore, even when the substrates become enlarged in diameter and/or when the interval between the substrates is decreased, the liquid drops of drying fluid are smoothly supplied into the gap between the substrates and the liquid layer of the drying fluid is continuously formed on the liquid face of the cleaning fluid so that rapid drying of the substrates is realized without drying marks. Further, the density of the drying fluid is not needed to be raised too high and the temperature of the drying fluid is not needed to be raised too high, so that the running cost is decreased. Also, though the drying fluid has explosiveness due to the inflammability of the drying fluid when the drying fluid is mixed with air, the explosiveness can be suppressed so that safety is improved.

In this case, when the introduction initial speed is equal to or greater than 10 m/sec and equal to or less than 330 m/sec, the above operation is realized. The introduction initial speed is more preferable to be equal to or greater than 50 m/sec and equal to or less than 150 m/sec. Disadvantages are prevented from occurrence such that the liquid drops of the drying fluid are not smoothly supplied to the gap between the substrates, and that vibration of the liquid surface of the cleaning fluid or the like becomes greater, so that the speed of the liquid face becomes a speed which is substantially greater than the optimum speed of MARANGONI drying, consequently the cleaning fluid remains on the surface of the substrates.

When the method for drying substrate is employed, the method can supply inert gas into the processing vessel during exhausting of the cleaning fluid from the processing vessel. Therefore, the interior of the processing vessel becomes negative pressured condition during exhausting of the cleaning fluid so that particles are prevented from intruding from the exterior.

When the method for drying substrate is employed, the method can increase the supplying quantity of the drying fluid and/or the inert gas into the processing vessel during exhausting of the cleaning fluid from the processing vessel. Therefore, the liquid drops of the drying fluid are securely supplied to the liquid face of the cleaning fluid by increasing the supplying quantity during exhausting of the cleaning fluid so that the thickness of the liquid layer of the drying fluid on the cleaning fluid is continuously maintained to be equal to or greater than a predetermined thickness.

When the method for drying substrate is employed, the method can change supporting position of the substrates during exhausting of the cleaning fluid from the processing vessel. Therefore, the supporting position of the substrates is also rapidly and securely dried.

When the method for drying substrate is employed, the method can make the interior of the processing vessel to be inert gas environment prior to exhausting of the cleaning fluid from the processing vessel. Therefore, generation of water mark on the surface of the substrate is greatly suppressed.

When the method for drying substrate is employed, the method can carry out the cleaning process and the following drying processing under a room temperature. Therefore, heating process is not needed at all, so that simplification in arrangement in entire system is realized and safety is improved.

When the method for drying substrate is employed, the method can flow the drying fluid by the pressure of inert gas which is supplied to the nozzle. Therefore, driving section for supplying the drying fluid is not needed at all, and cleanness is improved by preventing particles from mixing and intruding.

When the device for drying substrate is employed, the device can support substrates within a processing vessel by supporting means, and dry a surface of each substrate by relatively lowering a fluid face of cleaning fluid within a processing vessel with respect to the substrate and by introducing the cleaning fluid within the processing vessel.

During this operation, the device forms liquid drops of drying fluid using the nozzle, supplies the liquid drops of drying fluid onto the fluid face of the cleaning fluid using a nozzle by the drying fluid supplying means.

Therefore, the liquid drops of drying fluid is smoothly introduced between the substrates due to the influence of dead weight of the liquid conditioned drying fluid so that the drying fluid with high density with respect to the density of the vapor supplying so as to improve MARANGONI effect. Consequently, a liquid layer of the drying fluid having a sufficient thickness is generated on the cleaning fluid so that drying of the substrates with greatly little drying mark is rapidly realized using MARANGONI effect. Further, the thickness of the fluid layer of the drying fluid can be determined to be sufficiently great so that securely drying is performed up to the inner section (concave section) of a pattern even when the substrate has the pattern. Consequently, the method can deal with the high aspect ratio substrates and securely prevents the cleaning fluid from remaining on the surface of the substrates. Further, the drying fluid is supplied in a liquid drop condition, so that the entirety or almost of the drying fluid is discharged with the cleaning fluid. Consequently, leakage of the drying fluid is decreased up to nearly zero so that exhaust equipment is eliminated or is simplified. As a result, decrease in cost is realized.

In this case, when the liquid drop of drying fluid has a diameter which is greater than 100 μm and equal to or less than 1 mm, the above operation is realized following the supplying of the liquid drops. The liquid drop is more preferable to have a diameter which is greater than 100 μm and equal to or less than 200 μm. Disadvantages are prevented from occurrence such that the substrates are dried insufficiently due to shortage of supplying quantity of the drying fluid, that the cleaning fluid jumps so that the cleaning fluid is adhered to the substrates, and that the running cost is increased due to the increase of the drying fluid.

When the device for drying substrate is employed, the device can employ the supporting means which supports the substrates within the processing vessel in an inclined condition by a predetermined angle, and the device can employ the nozzle which supplies the liquid drops of drying fluid using the nozzle in a direction which is the same direction of the inclined substrates.

Therefore, when each substrate has a pattern on one face and when the pattern formed face of a plurality of substrates are positioned. In the same side, exhausting of the cleaning fluid is easily performed which is introduced within the inner section of the pattern so that more rapid and better drying is realized.

In this case, when the inclination angle is greater than 0° and equal to or less than 30°, the above operation is realized. The inclination angle is more preferable to be equal to or greater than 3° and equal to or less than 5°. Disadvantages are prevented from occurrence such that the cleaning fluid within the inner section of the pattern is difficult to be exhausted, that the drying fluid is difficult to be supplied to the dipping boundary face, and that the cleaning fluid exhausted from the pattern drops onto the neighboring substrate. In addition, the above operation is realized.

When the device for drying substrate is employed, the device can employ the drying fluid supplying means which determines an introduction direction of the drying fluid into the processing vessel and determines an introduction initial speed of the drying fluid so as to expand the drying fluid up to the entire width of the substrates on the fluid surface of the cleaning fluid.

Therefore, even when the substrates become enlarged in diameter and/or when the interval between the substrates is decreased, the liquid drops of drying fluid are smoothly supplied into the gap between the substrates and the liquid layer of the drying fluid is continuously formed on the liquid face of the cleaning fluid so that rapid drying of the substrates is realized without drying marks. Further, the density of the drying fluid is not needed to be raised too high and the temperature of the drying fluid is not needed to be raised too high, so that the running cost is decreased. Also, though the drying fluid has explosiveness due to the inflammability of the drying fluid when the drying fluid is mixed with air, the explosiveness can be suppressed so that safety is improved.

In this case, when the introduction initial speed is equal to or greater than 10 m/sec and equal to or less than 330 m/sec, the above operation is realized. The introduction initial speed is more preferable to be equal to or greater than 50 m/sec and equal to or less than 150 m/sec. Disadvantages are prevented from occurrence such that the liquid drops of the drying fluid are not smoothly supplied to the gap between the substrates, and that vibration of the liquid surface of the cleaning fluid or the like becomes greater, so that the speed of the liquid face becomes a speed which is substantially greater than the optimum speed of MARANGONI drying, consequently the cleaning fluid remains on the surface of the substrates.

When the device for drying substrate is employed, the device can further comprise inert gas supplying means for supplying inert gas into the processing vessel during exhausting of the cleaning fluid from the processing vessel. Therefore, the interior of the processing vessel becomes negative pressured condition during exhausting of the cleaning fluid so that particles are prevented from intruding from the exterior.

When the device for drying substrate is employed, the device can further comprise supplying quantity control means for increasing the supplying quantity of the drying fluid and/or the inert gas into the processing vessel during exhausting of the cleaning fluid from the processing vessel. Therefore, the liquid drops of the drying fluid are securely supplied to the liquid face of the cleaning fluid by increasing the supplying quantity following exhausting of the cleaning fluid so that the thickness of the liquid layer of the drying fluid on the cleaning fluid is continuously maintained to be equal to or greater than a predetermined thickness.

When the device for drying substrate is employed, the device can employ the supporting means which have a cleaning fluid introduction groove which follows in a lower ward direction with respect to the substrate supporting section. Therefore, drainage of the cleaning fluid at the substrate supporting section is improved.

When the device for drying substrate is employed, the device can employ a pair of supporting means for selectively supporting different positions of the substrates which positions are different from one another, and the device can further comprise supporting position control means for changing the supporting position of the substrates by the supporting means during exhausting of the cleaning fluid from the processing vessel. Therefore, the supporting position of the substrate is also dried rapidly and securely.

When the device for drying substrate is employed, the device can further comprise environment determination means for making the interior of the processing vessel to be inert gas environment prior to exhausting of the cleaning fluid from the processing vessel. Therefore, generation of water mark on the surface of the substrate is greatly suppressed.

When the device for drying substrate is employed, the device can further comprise nozzle position control means for moving the nozzle towards the substrates during exhausting of the cleaning fluid from the processing vessel. Therefore, the drying fluid with sufficient quantity is supplied onto the liquid face of the cleaning fluid without changing the introduction initial speed and the introduction flowing quantity of the liquid drops of the drying fluid.

In this case, the movable extent of the nozzle by the nozzle position control means is preferable to be greater than 0 mm and equal to or less than 500 mm so that the above operation is realized. The movable extent is more preferable to be equal to or greater than 250 mm and equal to or less than 350 mm. Disadvantages are prevented from occurrence such that the drying fluid does not intrude to the gap between the substrates, and that vibration of the liquid surface of the cleaning fluid or the like becomes greater, so that the speed of the liquid face becomes a speed which is substantially greater than the optimum speed of MARANGONI drying, consequently the cleaning fluid remains on the surface of the substrates.

When the device for drying substrate is employed, the device can further comprise circulation means for circulating the drying fluid when ejection is not carried out. Therefore, the pressure of the space in which the drying fluid exists is always determined to be greater than the pressure in exterior so as to prevent particles from intruding from exterior, and the usage quantity of the drying fluid is reduced so as to decrease the running cost.

When the device for drying substrate is employed, the device can employ the nozzles a number of which is determined in response to response to the size of the substrate and the pitch of the substrates. Therefore, uniform drying is realized on the entire face of the substrate.

When the device for drying substrate is employed, the device can employ the nozzle which has drying fluid ejection holes a number of which is greater than the number of the substrates by 1 which substrates are dried simultaneously. Therefore, liquid drops of the drying fluid are supplied to every gap between the substrates and the outer side of the substrates which are positioned at both ends so as to dry the entire surface of each substrate rapidly and uniformly (without generation of water mark).

When the device for drying substrate is employed, the device can further comprise inert gas supplying means for supplying inert gas to the nozzle so as to flow the drying fluid by the pressure of inert gas. Therefore, driving section for supplying the drying fluid is not needed at all, and cleanness is improved by preventing particles from mixing and intruding.

BEST MODE FOR CARRYING OUT THE INVENTION

Hereinafter, referring to the attached drawings, we explain a method and device for drying substrate of an embodiment according to the present invention in detail.

Figure 1:
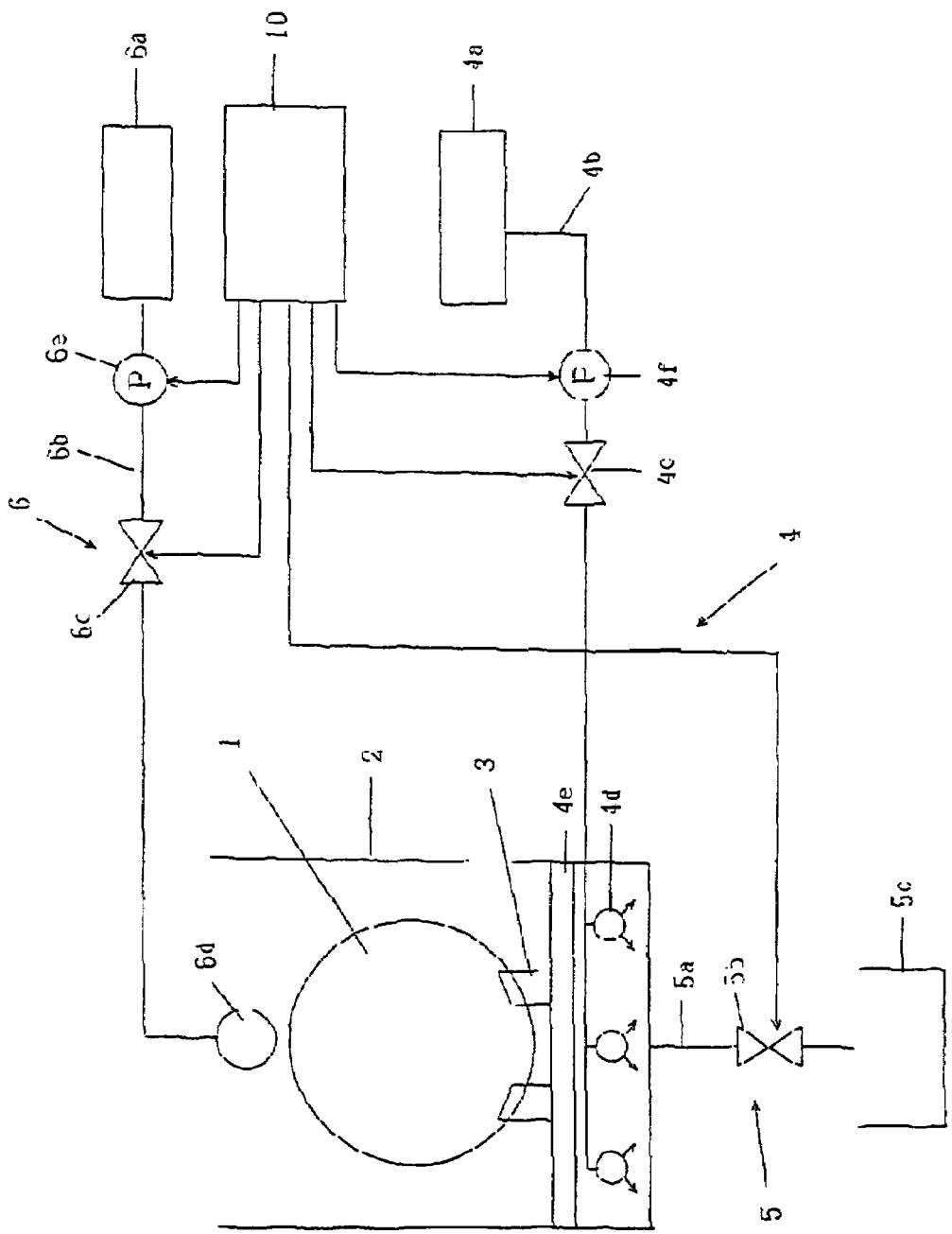
FIG. 1 is a schematic diagram illustrating an arrangement of a substrate processing apparatus of an example in which a device for drying substrate according to the present invention is applied.

FIG. 1 is a schematic diagram illustrating an arrangement of a substrate processing apparatus of an example in which a device for drying substrate according to the present invention is applied.

This substrate processing apparatus comprises a processing vessel 2 for housing a predetermined number of substrates 1 such as semiconductor wafer or the like which substrates 1 stand in parallel to one another, a first substrate supporting section 3 for supporting the substrates 1 within the processing vessel 2, a processing fluid supplying section 4 for supplying processing fluid (for example, pure water, deionized water, deoxidized water or the like when cleaning processing is carried out) 11 into the processing vessel 2 which processing fluid 11 is used for performing processing such as cleaning processing or the like for the substrates 1, an exhausting section 5 for exhausting the processing fluid 11 from the processing vessel 2, and a drying fluid supplying section 6 for supplying liquid drops 12 of drying fluid into the processing vessel 2 which drying fluid is used for performing drying processing for the substrates 1. The apparatus further comprises a control section 10 such as micro-computer or the like which controls the operation of the processing fluid supplying section 4, the exhausting section 5, and the drying fluid supplying section 6.

Figure 2:
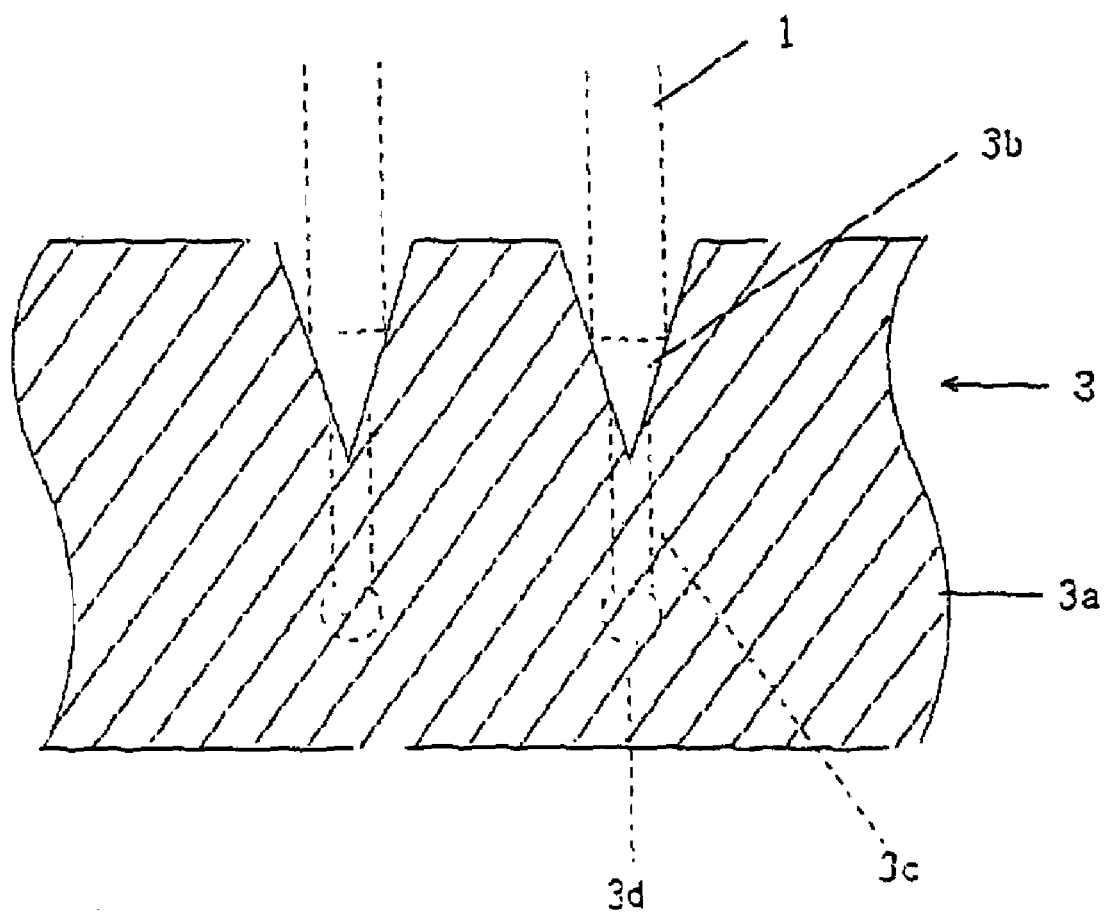
FIG. 2 is an enlarged cross sectional view illustrating an arrangement of a first substrate supporting section.

The first substrate supporting section 3 has a main body member 3a and a plurality of supporting grooves 3b having a cross sectional V-shape formed on the upper face of the main body member 3a, as is illustrated in FIG. 2. It is preferable that a slit 3c is further provided which elongates downward from the bottom section of each supporting groove 3b so as to improve drainage. The slit 3c can be considered to be a cleaning fluid introduction groove. It is more preferable that a round hole 3d is provided which is connected to the bottom section of the slit 3c so as to further improve drainage.

The processing fluid supplying section 4 has a processing fluid tank 4a, a processing fluid supplying pipe 4b for guiding the processing fluid 11 out from the processing fluid tank 4a, an open and close valve 4c and a pump 4f each provided at a predetermined position of the processing fluid supplying pipe 4b, a processing fluid nozzle 4d for blowing the processing fluid 11 into the processing vessel 2 which processing fluid 11 is supplied through the processing fluid supplying pipe 4b, and a regulation plate 4e for regulating the processing fluid 11 injected from the processing fluid nozzle 4d and for supplying the processing fluid 11 towards the substrates 1 housed within the processing vessel 2.

The exhausting section 5 has an exhausting pipe 5a provided at a predetermined position of the bottom section of the processing vessel 2, an open and close valve 5b provided at a predetermined position of the exhausting pipe 5a, and a waste tank 5c for housing the processing fluid exhausted through the exhausting pipe 5a.

The drying fluid supplying section 6 has a drying fluid tank 6a for housing the drying fluid (fluid having a surface tension which is smaller than that of the processing fluid) made of substantially non-reactive liquid such as isopropyl alcohol (IPA), ethyl alcohol, methyl alcohol, tetrahydrofuran, acetone, perfluorohexane, hexane or the like, a drying fluid supplying pipe 6b for guiding the drying fluid from the drying fluid tank 6a, an open and close valve 6c and a pump 6e each provided at a predetermined position of the drying fluid supplying pipe 6b, and a drying fluid nozzle 6d for blowing the drying fluid as liquid drops into the processing vessel 2 which drying fluid is supplied through the drying fluid supplying pipe 6b. The drying fluid nozzle 6d is sufficient that diameter of each liquid drop blowing opening and the like are determined so as to form the liquid drops 12 each has a diameter which is greater than 100 µm and equal to or less than 1 mm. The drying fluid nozzle 6d is preferable that diameter of each liquid drop blowing opening and the like are determined so as to form the liquid drops 12 each has a diameter which is greater than 100 µm and equal to or less than 200 µm. When the diameter of each liquid drop is determined in such manner, disadvantages are prevented from occurrence such that the substrates are dried insufficiently due to shortage of supplying quantity of the drying fluid, that the cleaning fluid jumps so that the cleaning fluid is adhered to the substrates, and that the running cost is increased due to the increase of the drying fluid. Further, the drying fluid nozzle 6d is sufficient that inner diameter of the drying fluid nozzle 6d, diameter of each liquid drop blowing opening and the like are determined so as to determine the blowing speed of the liquid drops 12 to be equal to or greater than 10 m/sec and equal to or less than 330 m/sec. The drying fluid nozzle 6d is preferable that inner diameter of the drying fluid nozzle 6d, diameter of each liquid drop blowing opening and the like are determined so as to determine the blowing speed of the liquid drops 12 to be equal to or greater than 120 m/sec and equal to or less than 220 µm. When the blowing speed of the liquid drops is determined in such manner, disadvantages are prevented from occurrence such that the liquid drops of the drying fluid are not smoothly supplied to the gap between the substrates, and that vibration of the liquid surface of the cleaning fluid or the like becomes greater, so that the speed of the liquid face becomes a speed which is substantially greater than the optimum speed of MARANGONI drying, consequently the cleaning fluid remains on the surface of the substrates. Furthermore, the drying fluid nozzle 6d is sufficient that inner diameter of the drying fluid nozzle 6d and others are determined so as to determine the flowing quantity of the drying fluid to be equal to or greater than 0.1 cc/min and equal to or less than 20 cc/min. The drying fluid nozzle 6d is preferable that inner diameter of the drying fluid nozzle 6d and the like are determined so as to determine the flowing quantity of the drying fluid to be equal to or greater than 0.5 cc/min and equal to or less than 2 cc/min. Furthermore, the distance between the drying fluid nozzle 6d and the substrate 1 is sufficient to be greater than 0 mm and equal to or less than 500 mm. The distance between the drying fluid nozzle 6d and the substrate 1 is preferable to be equal to or greater than 50 mm and equal to or less than 150 mm. When the distance between the drying fluid nozzle 6d and the substrate 1 is determined in such manner, disadvantages are prevented from occurrence such that the liquid drops of the drying fluid are not smoothly supplied to the gap between the substrates, and that vibration of the liquid surface of the cleaning fluid or the like becomes greater, so that the speed of the liquid face becomes a speed which is substantially greater than the optimum speed of MARANGONI drying, consequently the cleaning fluid remains on the surface of the substrates. In the above embodiment, instead the pump 6e, it is possible that inert gas is supplied to the drying fluid nozzle 6d so as to suck the drying fluid through the drying fluid supplying pipe 6b and to blow the sucked drying fluid as the liquid drops with the inert gas. In this case, generation of particles due to the driving section of the pump 6e is prevented from occurrence.

The drying fluid nozzle 6d is preferable to be made of chemical resistance material such as fluorine-contained polymers {preferably, PFA, PCTFE, PEEK (polyetheretherketone)}. Biting is prevented even in hydrofluoric acid environment.

Operation of the substrate processing apparatus having the above arrangement is as follows.

First, the open and close valves 5b and 6c are closed, the open and close valve 4c is opened, and the pump 4f is driven by the control section 10. In this condition, the processing fluid 11 is supplied to the processing fluid nozzle 4d through the processing fluid pipe 4b from the processing fluid tank 4a, then the processing fluid is blown within the processing vessel 2 from the processing fluid nozzle 4d. The processing fluid 11 blown within the processing vessel 2 is regulated by the regulation plate 4e and is guided to the substrate housing space so that the processing for the surface of the substrates 1 (for example, cleaning processing or the like) is carried out. During this processing, the processing fluid 11 overflowed from the processing vessel 2 is collected by a collection mechanism (not illustrated). Further, entire surface of all substrates 1 are processed almost uniformly by determining the flowing speed of the processing fluid 11 corresponding to the center of the substrate 1 to be the fastest speed.

After the processing of the substrates 1 by the processing fluid 11 has been finished, the open and close valve 4c is closed, the open and close valves 5b and 6c are opened, and the pump 6e is driven by the control section 10. Under this condition, the processing fluid 11 is exhausted through the exhausting pipe 5a from the processing vessel 2 so that the liquid face of the processing fluid 11 gradually descends. At the same time, the drying fluid is supplied to the drying fluid nozzle 6d through the drying fluid supplying pipe 6b from the drying fluid tank 6a and is blown as the liquid drops within the processing vessel 2 from the drying fluid nozzle 6d so that the liquid layer of the drying fluid is formed on the liquid face of the processing fluid 11. This liquid layer is rapidly formed to have a relatively thick thickness because the drying fluid is supplied under the liquid drop condition. In other words, when the drying fluid is supplied under the mist condition, the diameter is equal to or less than 100 μm so that it is difficult to supply the drying fluid to the center section or lower section of the substrates 1 under the condition in which the interval between the substrates 1 is small. Consequently, it is difficult to increase the thickness of the liquid layer of the drying fluid. When this embodiment is employed, the drying fluid is supplied under the liquid drop condition so that it is possible to supply the drying fluid to the center section or lower section of the substrates 1 under the condition in which the interval between the substrates 1 is small. Consequently, it is possible to increase the thickness of the liquid layer of the drying fluid. As a result, superior drying of the substrates 1 is realized.

The substrates 1 are gradually exposed from the liquid face of the processing fluid 11 following the gradually descending of the liquid face of the processing fluid 11. But, liquid layer of the drying fluid is formed on the exposed section of the substrates 1 so that the exposed section is rapidly and uniformly dried by the MARANGONI effect.

Therefore, entire surface of the substrates 1 is rapidly and uniformly dried by the MARANGONI effect, finally. Of course, the processing fluid 11 is prevented from remaining on the surface of the substrates 1.

The supported section among the surface of the substrates 1 supported by the supporting groove 3b of the first substrate supporting section 3 contacts the first substrate supporting section 3 and very small space exists beneath the substrates 1. Therefore, drying of this section may be insufficient (insufficient in drying degree, and required time for drying). But, when a slit 3c is formed in continuous to the supporting groove 3b, and when a round hole 3d is further formed corresponding to the necessity, drainage of the processing fluid is improved by the slit 3c and the round hole 3d so that drying of the section is sufficient.

When this embodiment is employed, the thickness of the liquid layer of the drying fluid can be determined to be greater. Therefore, the liquid layer of the drying fluid is formed up to the inner section (concave section) of the pattern so as to rapidly and uniformly dry the entire surface of the substrates 1 including the inner section of the pattern by the MARANGONI effect, even when the substrates 1 are employed which are formed the pattern on their surface. As a result, substrates having a high aspect ratio can be dealt.

Further, the blowing speed of the liquid drops of the drying fluid is determined to be the above speed, the drying fluid is securely supplied onto the liquid face of the processing fluid 11 so as to form the liquid layer of the drying fluid even when the interval between the substrates 1 is determined to be small. Of course, the liquid layer of the drying fluid is formed on the exposed portion of the substrates 1 from the liquid face of the processing fluid 11.

Furthermore, it is preferable to carry out the above processing under the room temperature. In this case, heating devices are not needed so that the arrangement of the substrate processing apparatus can be simplified, and the safety is improved.

Figure 3:
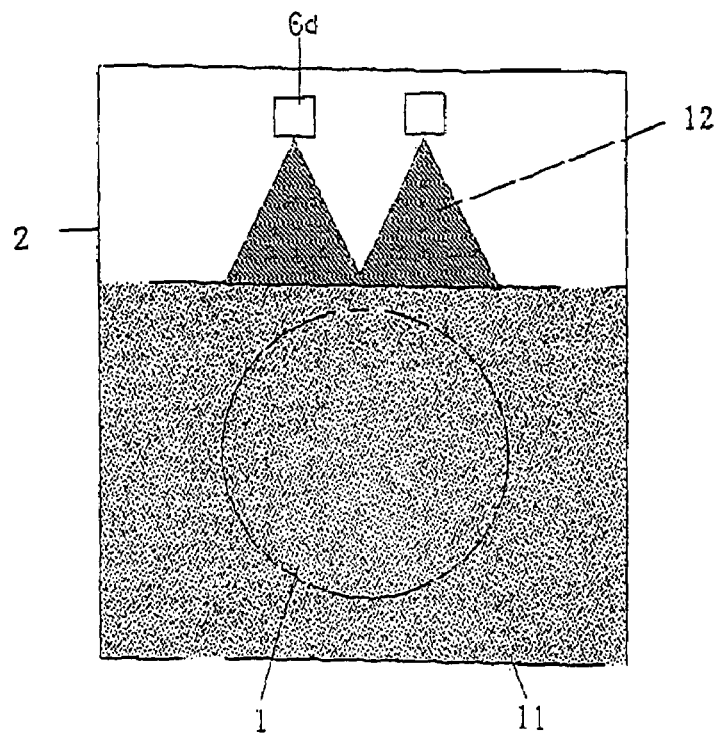
FIG. 3 is a schematic diagram illustrating a main section of a substrate processing apparatus of another example.
Figure 4:
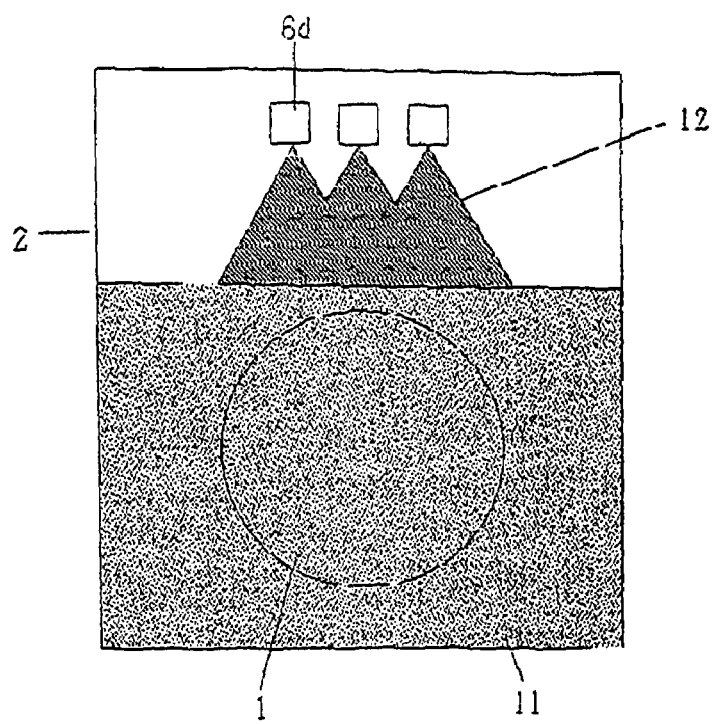
FIG. 4 is a schematic diagram illustrating a main section of a substrate processing apparatus of a further example.

FIG. 3 is a schematic diagram of a main portion of a substrate processing apparatus of another example, while FIG. 4 is a schematic diagram of a main portion of a substrate processing apparatus of a further example.

These substance processing apparatus are different from the substrate processing apparatus illustrated in FIG. 1 only in the number of drying fluid nozzles 6d. Specifically, the substrate processing apparatus illustrated in FIG. 3 has two drying fluid nozzles 6d, while the substrate processing apparatus illustrated in FIG. 4 has three drying fluid nozzles 6d.

When those examples are employed, entire surface of the substrates 1 are dried uniformly, even when the substrates 1 becomes large in size and when the interval between the substrates 1 becomes small.

Figure 5:
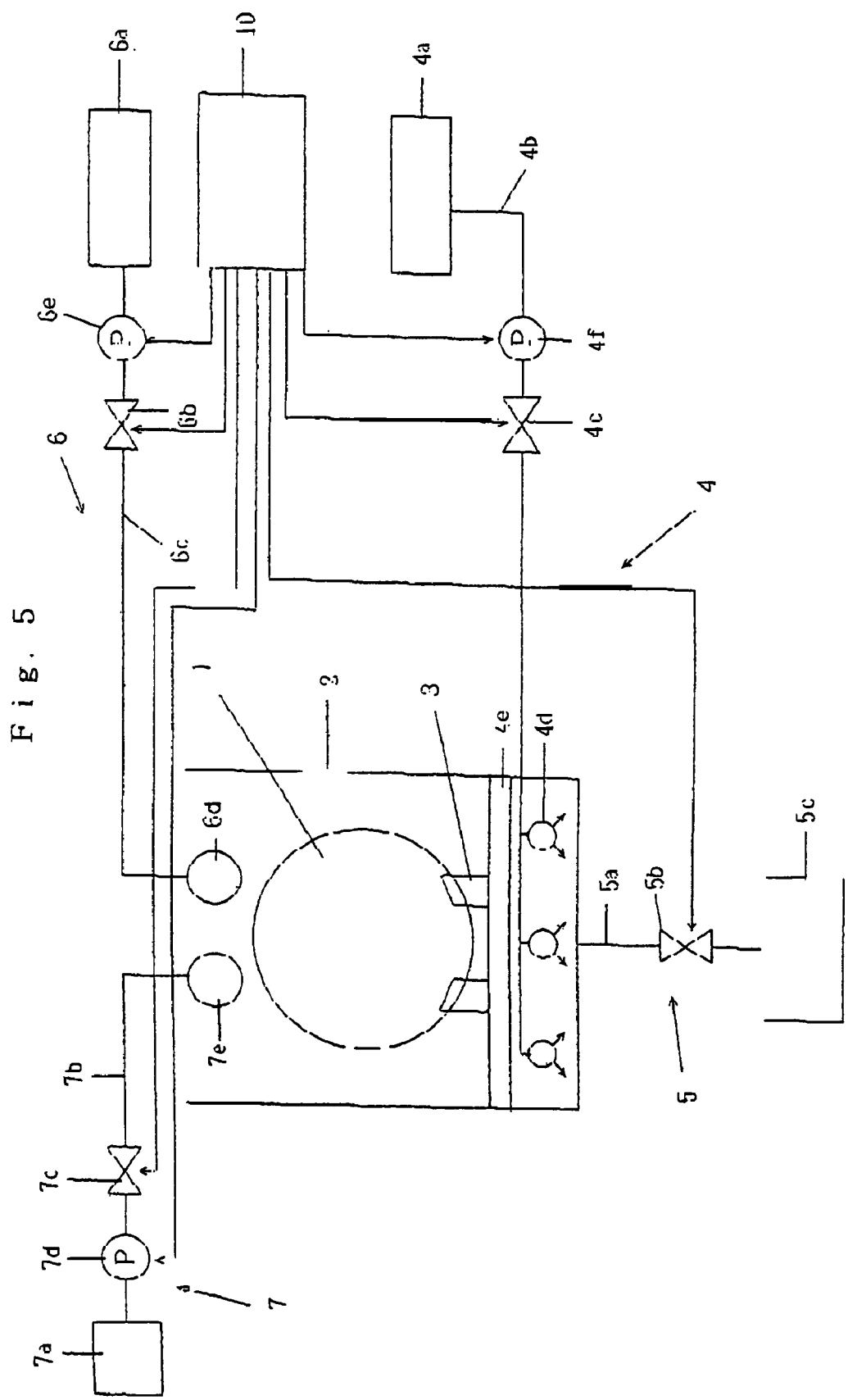
FIG. 5 is a schematic diagram illustrating a main section of a substrate processing apparatus of a yet example.

FIG. 5 is a schematic diagram of a main portion of a substrate processing apparatus of a yet example.

This substrate processing apparatus is different from the above embodiment only in that an inert gas supplying section. 7 is further provided which has an inert gas tank 7a, an inert gas supplying pipe 7b for guiding inert gas such as nitrogen or the like from the inert gas tank 7a, an open and close valve 7c and pump 7d each provided at a predetermined position of the inert gas supplying pipe 7b, and an inert gas nozzle 7e for blowing the inert gas supplied through the inert gas supplying pipe 7b. The inert gas nozzle 7e can be united with the drying fluid nozzle 6d. Further, the flowing quantity of the inert gas is sufficient to be greater than 0 liter/min and equal to or lesser than 200 liter/min. The flowing quantity of the inert gas is preferable to be greater than 5 liter/min and equal to or lesser than 20 liter/min. Furthermore, the inert gas supply section 7 is controlled by the control section 10.

When this example is employed, disadvantage is prevented from occurrence in that the interior of the processing vessel 2 becomes negative pressured condition with respect to the exterior so that particles intrude from the exterior, by supplying the inert gas within the processing vessel 2.

Further, it is preferable that the flowing quantity of the liquid drops 12 of the drying fluid and/or the flowing quantity of the inert gas are increased when the processing fluid is exhausted. The liquid drops 12 of the drying fluid is securely supplied to the liquid face of the processing fluid 11 so as to form the liquid layer of the drying fluid even when the liquid face of the processing face is descended.

Furthermore, the interior of the processing vessel 2 can be made to be the inert gas environment prior to the exhausting of the processing fluid. In this case, generation of water marks on the substrates 1 is suppressed.

Figure 6:
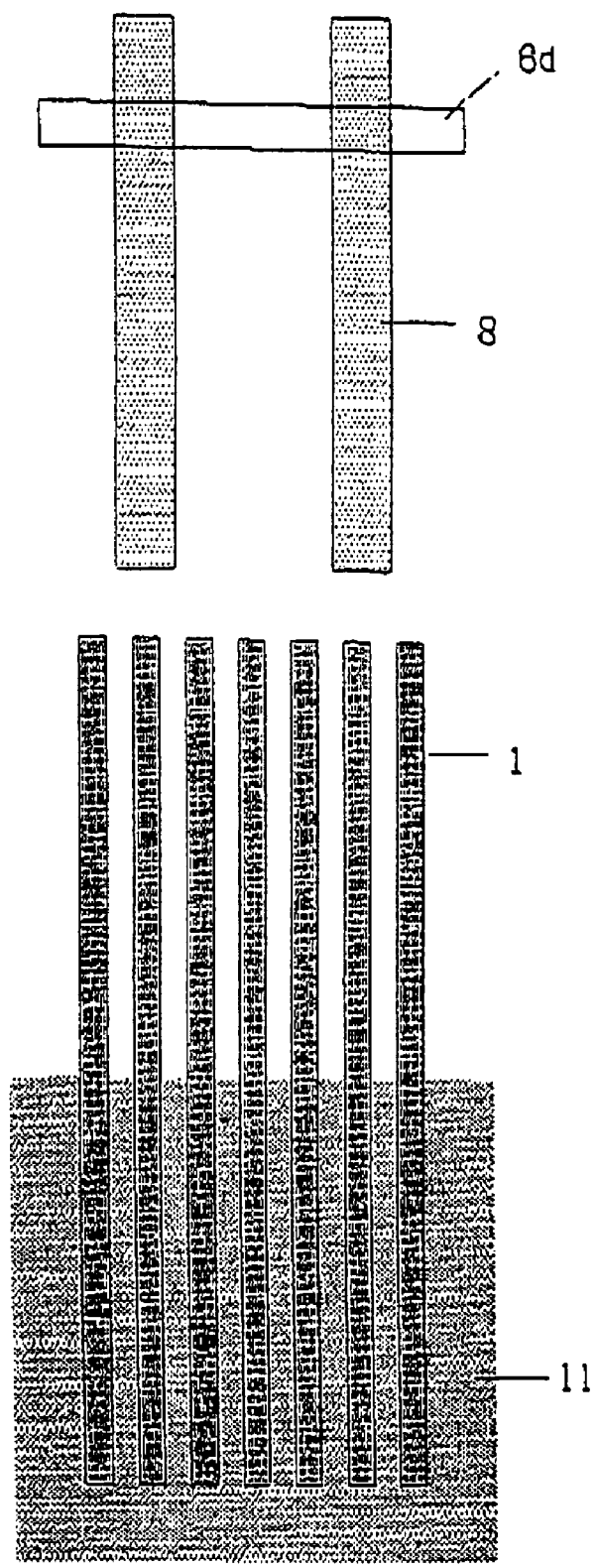
FIG. 6 is a schematic diagram illustrating a main section of a substrate processing apparatus of yet another example.

FIG. 6 is a schematic diagram of a main portion of a substrate processing apparatus of yet another example.

This substrate processing apparatus is different from the above embodiment only in that an elevation section 8 for moving the drying fluid nozzle 6d up and down. Wherein, well known moving to and fro mechanism such as rack and pinion mechanism, piston mechanism, or the like is employed as the moving to and fro mechanism 8. And, the elevation distance is sufficient to be greater than 0 mm and equal to or less than 500 mm. The elevation distance is preferable to be equal to or greater than 250 mm and equal to or less than 350 mm. The elevation mechanism 8 is also controlled by the control section 10.

Figure 7:
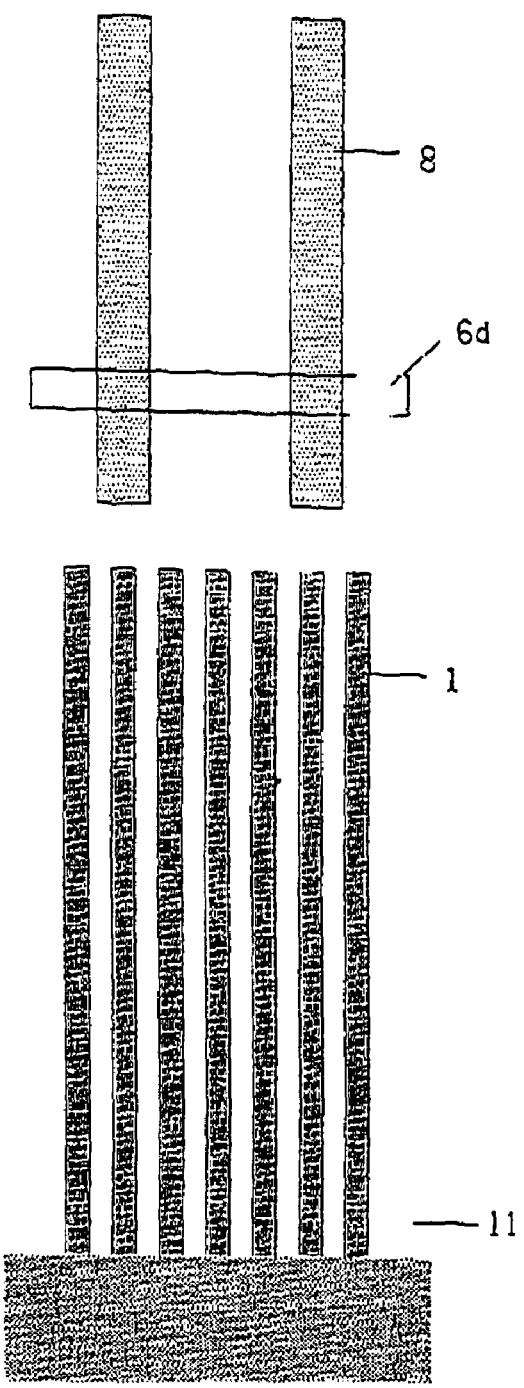
FIG. 7 is a schematic diagram illustrating a fluid nozzle for drying under a downward moved condition.

When this example is employed, the drying fluid nozzle 6d is descended when the processing fluid is exhausted. Therefore, the liquid drops 12 of the drying fluid is securely supplied to the liquid face of the processing fluid 11 so as to form the liquid layer of the drying fluid even when the liquid face of the processing face is descended (refer to FIG. 7).

Figure 8:
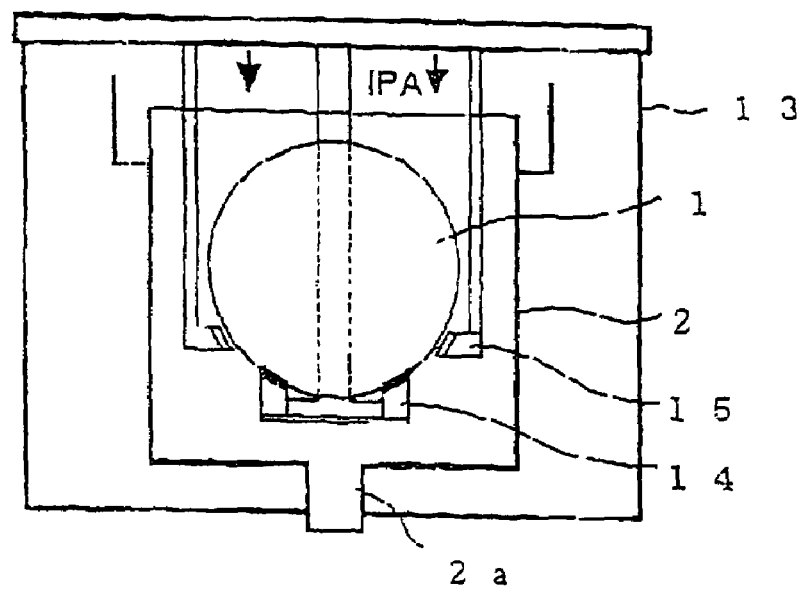
FIG. 8 is a schematic diagram illustrating a main section of a substrate processing apparatus of a yet further example.

FIG. 8 is a schematic diagram of a main portion of a substrate processing apparatus of a yet further example.

This substrate processing apparatus has a processing vessel 2, an outer vessel 13 for surrounding the processing vessel 2 which outer vessel 13 can be sealed, a first supporting member 14 for supporting the substrates (for example, semiconductor wafers) 1 in a standing condition and for transporting the substrates 1 to and from the processing vessel 2, and a second supporting member 15 which can be moved up and down and can be transport the substrates between the first supporting member 14. Further, the reference numeral 2a represents a cleaning fluid exhaust pipe for exhausting the cleaning fluid (for example, pure water) from the processing vessel 2.

The operation of the substrate processing apparatus having the above arrangement is as follows.

When the cleaning of the substrates 1 has finished, the processing vessel 2 is filled with the cleaning fluid (for example, pure water) and the substrates 1 are supported by the first supporting member 14 in a natural condition and are dipped within the cleaning fluid. In this condition, the substrates 1 are apart from the second supporting member 15. Then, the drying fluid (for example, isopropyl alcohol vapor, mist or the like) is supplied within the outer vessel 13 through the cover body of the sealed outer vessel for drying the cleaned substrates 1, and the cleaning fluid is exhausted through the cleaning fluid exhausting pipe 2a from the processing vessel 2.

When this operation is carried out, the cleaning fluid is exchanged with the drying fluid layer so as to perform rapid drying in the exposed portion of the substrates 1 from the cleaning fluid.

Figure 9:
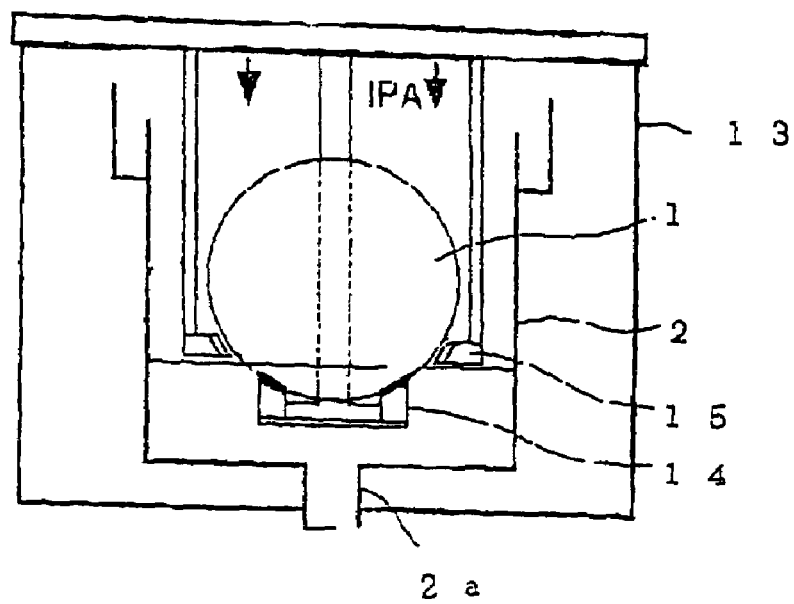
FIG. 9 is a schematic cross sectional view illustrating a cleaning fluid decreased condition.

When the exhausting of the cleaning fluid is continuously carried out, the liquid face of the cleaning fluid gradually descends. When the liquid face is positioned between the second supporting member 15 and the first supporting member 14, as is illustrated in FIG. 9, the second supporting member 15 is dried and the portion of the substrates 1 are also dried which are to be supported by the second supporting member 15.

Figure 10:
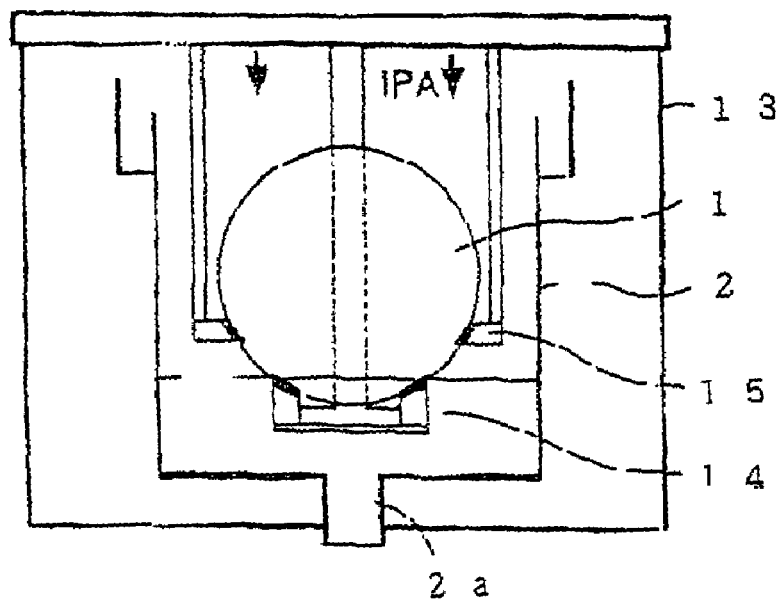
FIG. 10 is a schematic cross sectional view illustrating a substrate transferring condition.
Figure 11:
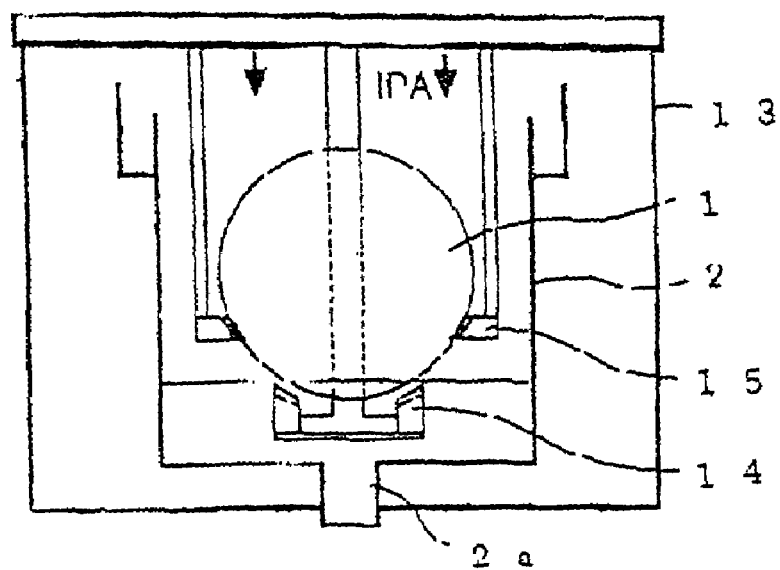
FIG. 11 is a schematic vertical cross sectional view illustrating a condition after the substrate has transferred.

Then, the second supporting member 15 is moved upward so as to engage the substrates 1 (refer to FIG. 10). Thereafter, the first supporting member 14 is moved downward so that the substrates 1 are transferred from the first supporting member 14 to the second supporting member 15 (refer to FIG. 11). During the transferring operation of the substrates 1, the relative position of the substrates 1 with respect to the processing vessel 2 is maintained to be a constant position. Therefore, the relative speed of the substrates 1 with respect to the liquid face of the cleaning fluid is maintained to be a constant speed so that the substrates 1 are dried uniformly.

Supplying of the drying fluid and exhausting of the cleaning fluid are carried out thereafter, so that the remaining portion of the substrates 1 and the first supporting member 14 are dried.

After the exhausting of the cleaning fluid has finished, no cleaning fluid remains on the contacted section of the substrates 1 to the first supporting member 14 and the second supporting member 15. Therefore, the drying fluid is exhausted from the interior of the processing vessel 2 and the outer vessel 13 by supplying the nitrogen gas through the cover body of the outer vessel 13 so that the drying processing of the substrates 1 is finished. As a result, usage quantity of the nitrogen gas can be decreased, and the entire processing time can be shortened.

When the drying processing has finished by performing the above operation, the dried substrates 1 can be taken out from the processing vessel 2 by opening the outer vessel 13 and by moving the first supporting member 14 upward.

When the substrates 1 are transferred in such manner, drying of the substrates 1 is finished by 4~5 minutes.

Specifically, when the semiconductor wafer is employed as the substrate 1, IPA is employed as the drying fluid, the flowing quantity of the drying fluid is determined to be 4 cc/min, pure water is employed as the processing fluid, nitrogen is employed as the inert gas, the flowing quantity of the inert gas is determined to be 20 liter/min, the drying nozzle 6*d* made of PEEK is employed, a number of the drying nozzles 6*d* is determined to be 2, the diameter of the drying fluid blowing hole formed in the drying fluid nozzle 6*d* is determined to be 0.2 mm, the length of the drying fluid blowing hole (thickness of the wall member of the drying fluid nozzle 6*d*) is determined to be 1 mm, a number of the drying fluid blowing holes is determined to be 51 (corresponding to the 50 substrates 1), a vertical position of the drying fluid nozzle 6*d* is determined to be a position which is above the upper face of the substrate by 100 mm, a horizontal positions of the drying fluid nozzle 6*d* is determined to be a positions each position being apart from the center of the substrates 1 by 75 mm, the exhausting speed of the processing fluid is determined to be 2 mm/sec, and when the semiconductor wafers are dried by transferring the semiconductor wafers, the required time for drying was 4 minutes. Further, in this specific example, diameter of the liquid drop was about 190 µm, the thickness of the liquid layer of the drying fluid was 50 µm which is an average within the entire dipping boundary face (the liquid layer is thick at the position which is directly under the drying fluid nozzle 6*d*, while the liquid layer is thin at the position which is near the edge of the substrates), and the blowing speed was 208 m/sec.

Figure 12:
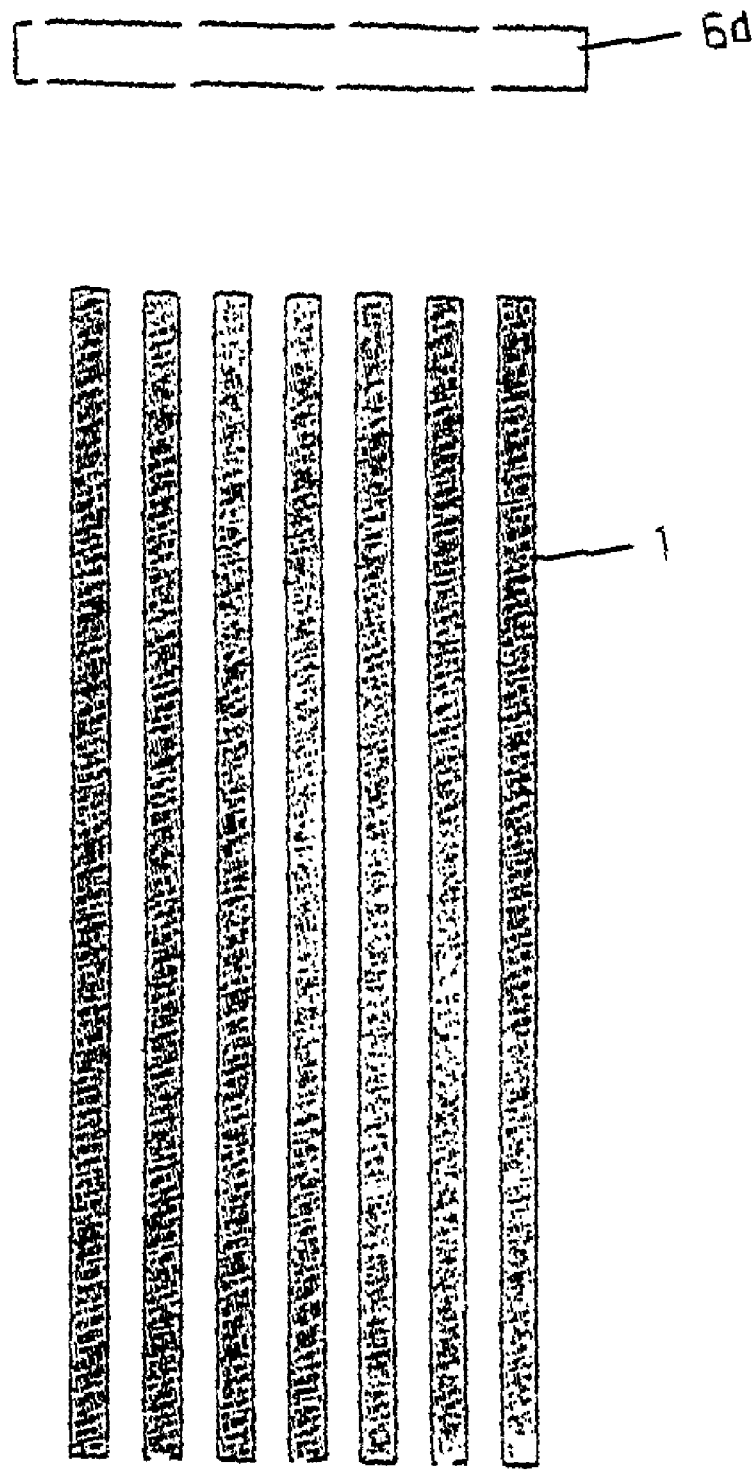
FIG. 12 is a schematic diagram illustrating a main section of a substrate processing apparatus of a further example.

FIG. 12 is a schematic diagram of a main portion of a substrate processing apparatus of a further example.

This substrate processing apparatus is different from the above substrate processing apparatus in that the substrates 1 are supported under an inclined condition by a predetermined angle with respect to the vertical face instead of the substrates 1 being supported under a vertical condition, and that the drying fluid nozzle 6*d* is inclined so as to blow the liquid drops 12 of the drying fluid to suit the inclination of the substrates 1. Wherein the inclination angle is sufficient to be greater than 0° and equal to or less than 30°. The inclination angle is preferable to be equal to or greater than 3° and equal to or less than 5°

When this example is employed, drying of the substrates 1 which have already formed a pattern on one surface is carried out rapidly and uniformly. Further, disadvantages are prevented from occurrence such that the cleaning fluid within the inner section of the pattern is difficult to be exhausted, that the drying fluid is difficult to be supplied to the dipping boundary face, and that the cleaning fluid exhausted from the pattern drops onto the neighboring substrate.

Description is Made in More Detail.

Figure 13:
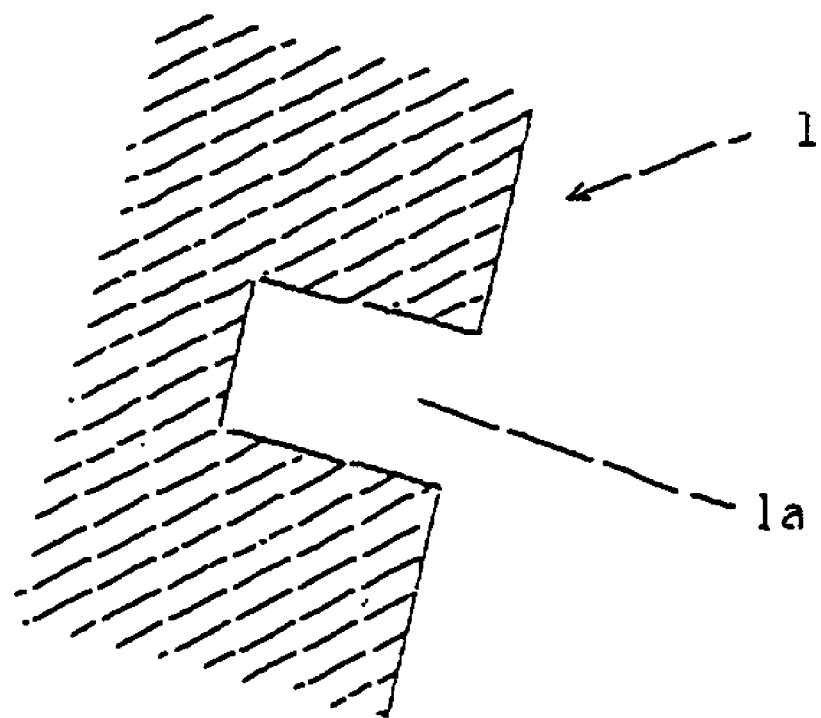
FIG. 13 is an enlarged cross sectional view of a substrate which is applied to the substrate processing apparatus illustrated in FIG. 12.

When the pattern is formed on one surface of each substrate 1 it is sufficient that each substrate 1 is inclined so as to be the pattern formed face becomes a downward look. Under this condition, the concave section 1*a* formed following the formation of the pattern becomes a downward look to some degree, as is illustrates in FIG. 13, so that exhausting of the processing fluid 11 is smoothly performed from at least a partial part of the concave section 1*a* which is positioned above the liquid face of the processing fluid 11 which gradually descends. As a result, the quantity of the processing fluid 11 remaining within the concave section 1*a* is greatly reduced, so that drying of the surface of the substrates 1 following the forming of the liquid of the drying fluid is realized more satisfactorily.

Figure 14:
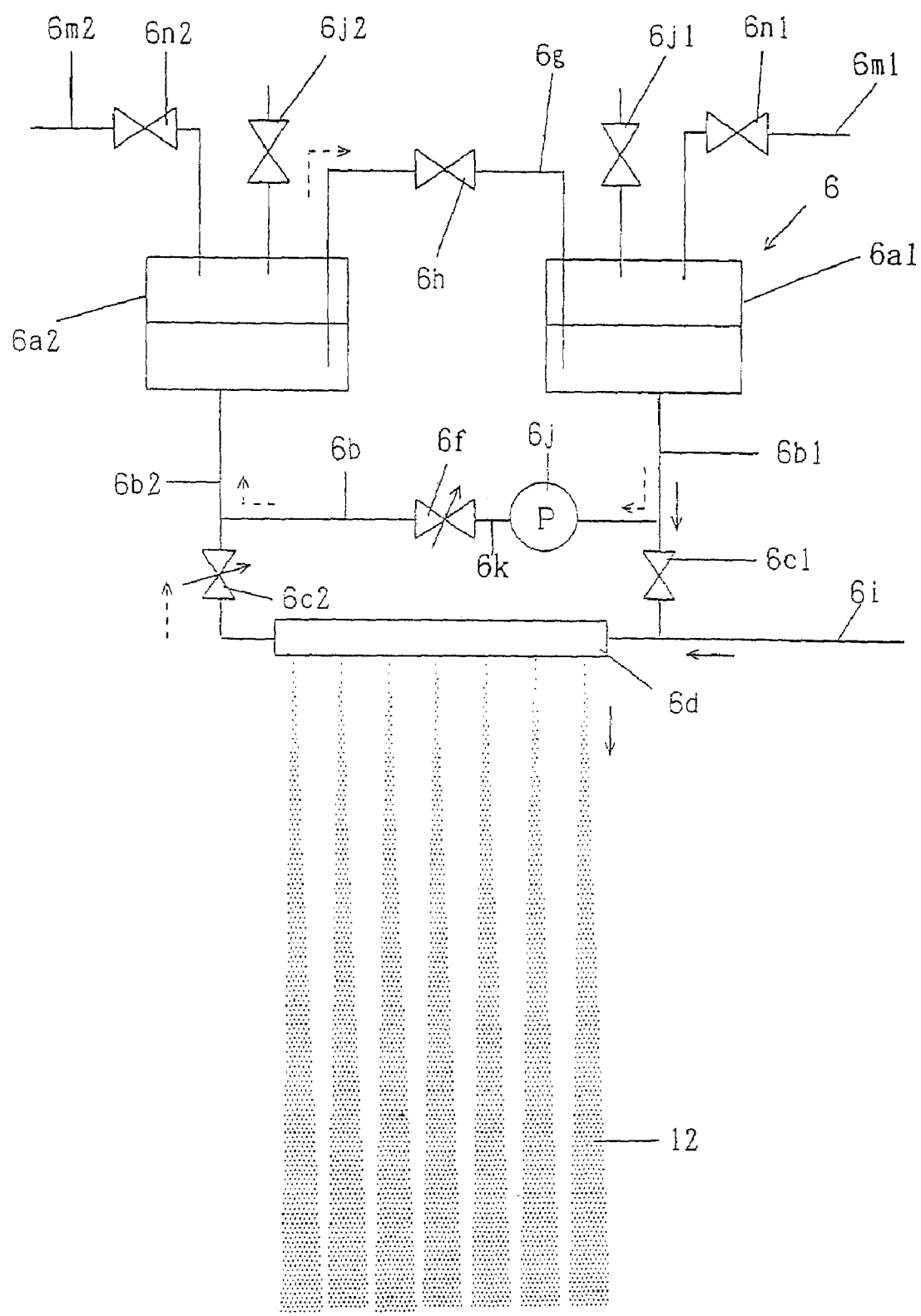
FIG. 14 is a schematic diagram illustrating a main section of a substrate processing apparatus of a yet further example.

FIG. 14 is a schematic diagram illustrating substrate processing apparatus of a further example.

This substrate processing apparatus is different from the above example only in that the drying fluid supplying section 6 has a different arrangement.

The drying fluid supplying section of this example has a pair of drying fluid tanks 6*a*1 and 6*a*2, a first and second communication pipes 6*b*1 and 6*b*2 for communicating each drying fluid tank 6*a*1 or 6*a*2 and the drying fluid nozzle 6*d*, open and close valves 6*c*1 and 6*c*2 each provided at a predetermined position of each communication pipe 6*b*1 or 6*b*2, a first circulation pipe 6*k* for communicating predetermined positions of both communication pipes 6*b*1 and 6*b*2 which predetermined positions are upstream side with respect to the open and close valves 6*c*1 and 6*c*2, an open and close valve 6*f* provided at a predetermined position of the first circulation pipe 6*k*, a second circulation pipe 6*g* for communicating both drying fluid tanks 6*a*1 and 6*a*2, and an open and close valve 6*h* provided at a predetermined position of the second circulation pipe 6*g*. Further, the reference numeral 6I represents an inert gas supplying pipe for supplying inert gas to the drying fluid nozzle 6*d*, reference numerals 6*j*1 and 6*j*2 represent relief valves each provided at each drying fluid tank 6*a*1 or 6*a*2, reference numerals 6*m*1 and 6*m*2 represent inert gas supplying pipes for supplying inert gas to each drying fluid tanks 6*a*1 or 6*a*2, and reference numerals 6*n*1 and 6*n*2 represent open and close valves each provided at a predetermined position of each inert gas supplying pipe 6*m*1 or 6*m*2. Further, the open and close valves 6*c*1 and 6*c*2 have flowing quantity adjusting function.

Furthermore, the drying fluid tank 6*a*1 is determined to be a main tank, while the drying fluid tank 6*a*2 is determined to be a reserve tank.

When this example is employed, a condition for blowing the liquid drops 12 of the drying fluid and a condition for circulating the drying fluid can be selected by the following manner.

When blowing operation is carried out for blowing the liquid drops of the drying fluid:

When this operation is carried out, the open and close valves 6*n*1, 6*c*1, 6*c*2 and 6*j*2 are opened by the control section, while the open and close valves 6*f,* 6*n*2, 6*h* and 6*j*1 are closed by the control section.

Under this condition, the inert gas is supplied to the drying fluid tank 6*a*1 through the inert gas supplying pipe 6*m*1 so that the drying fluid is transferred by pressure to the drying fluid nozzle 6*d* through the first communication pipe 6*b*1. The drying fluid nozzle 6*d* is supplied inert gas through the inert gas supplying pipe 6*i*. Therefore, the drying fluid and the inert gas are blown together from the drying fluid nozzle 6*d*, consequently the drying fluid is blown as liquid drops 12 (refer to solid arrows in FIG. 14).

When blowing operation is not carried out:

When this operation is carried out, the open and close valves 6*f,* 6*j*1 and 6*j*2 are opened by the control section, while the open and close valves 6*c*1, 6*c*2, 6*h*, 6*n*1 and 6*n*2 are closed by the control section.

Under this condition, the communication between both drying fluid tanks 6*a*1 and 6*a*2 and the drying fluid nozzle 6*d* is intercepted, while the communication between both drying fluid tanks 6*a*1 and 6*a*2 is maintained. Therefore, the drying fluid within the drying fluid tank 6*a*1 is moved to the drying fluid tank 6*a*2 when the interior of the drying fluid tank 6*a*1 has a higher pressure (refer to dashed arrows in FIG. 14). Under this condition, the drying fluid is not consumed so that the consumption quantity of the drying fluid is reduced and that the running cost is reduced.

When the drying fluid is moved from the drying fluid tank 6*a*2 to the drying fluid tank 6*a*1:

When this operation is carried out, the open and close valves 6*h*, 6*j*1 and 6*n*2 are opened by the control section, while the open and close valves 6c1, 6c2, 6f, 6j2 and 6n1 are closed by the control section.

Under this condition; both drying fluid tanks 6a1 and 6a2 are communicated by only the second communication pipe 6g, while the inert gas is supplied to only the drying fluid tank 6a2. Therefore, the drying fluid within the drying fluid tank 6a2 is moved to the drying fluid tank 6a1.

Further, during the drying fluid being circulated, the inert gas is supplied to the drying fluid tank 6a through the second communication pipe 6b2. Therefore, the pressure within the circulation passage is determined to be higher than the exterior pressure, so that particles are prevented from intruding from the exterior (refer to dashed arrows in FIG. 11).

INDUSTRIAL APPLICABILITY

This invention is applicable to the usage for drying the surface of substrates such as semiconductor wafers, and realizes rapid and uniformly drying.

What is claimed is:

1. A method for drying substrates which dries a surface of each of the substrates, comprising:
    housing substrates within a processing vessel containing a cleaning fluid;
    lowering a fluid face of the cleaning fluid within the processing vessel with respect to the substrates;
    introducing a drying fluid under a liquid condition within the processing vessel using a nozzle with the nozzle forming individual liquid drops of the drying fluid and supplying the liquid drops onto the fluid face of the cleaning fluid such that a liquid layer of the drying fluid on the cleaning fluid is continuously maintained;
    supplying inert gas into the processing vessel during exhausting of the cleaning fluid from the processing vessel;
    controlling the lowering a fluid face, the introducing a drying fluid and the supplying inert gas with a control section; and
    determining an introduction direction of the drying fluid into the processing vessel and determining an introduction initial speed of the drying fluid so as to expand the drying fluid up to an entire width of the substrates on the fluid face of the cleaning fluid.

2. A method for drying substrates as set forth in claim 1, wherein
    the method houses the substrates within the processing vessel in an inclined condition at a predetermined angle with respect to a vertical plane, and supplies the liquid drops of the drying fluid using the nozzle with the nozzle inclined at an inclination angle same as the predetermined angle of the inclined substrates.

3. A method for drying substrates as set forth in claim 1, wherein
    the method increases a supplying quantity of the drying fluid and/or the inert gas into the processing vessel during exhausting of the cleaning fluid from the processing vessel.

4. A method for drying substrates as set forth in claim 1, wherein
    the method changes supporting positions of the substrates during exhausting of the cleaning fluid from the processing vessel.

5. A method for drying substrates as set forth in claim 1, wherein
    the method makes an interior of the processing vessel an inert gas environment prior to exhausting of the cleaning fluid from the processing vessel.

6. A method for drying substrates as set forth in claim 1, wherein
    the method carries out the lowering of the fluid face of the cleaning fluid and the introducing of the drying fluid in the liquid condition at a room temperature.

7. A method for drying substrates as set forth in claim 1, wherein
    the method supplies inert gas to the nozzle, and flows the drying fluid by a pressure of the inert gas which is supplied to the nozzle.

8. A device for drying substrates which dries a surface of each of the substrates, the device comprising:
    a processing vessel containing a cleaning fluid;
    means for supporting substrates within the processing vessel;
    means for relatively lowering a fluid face of the cleaning fluid within the processing vessel with respect to the substrates;
    means for introducing a drying fluid under a liquid condition within the processing vessel using a nozzle with the nozzle forming individual liquid drops of the drying fluid and supplying the liquid drops of the drying fluid onto the fluid face of the cleaning fluid;
    means for supplying inert gas into the processing vessel during exhausting of the cleaning fluid from the processing vessel; and
    means for controlling the means for supplying, the means for introducing and the means for relatively lowering and for maintaining a liquid layer of the drying fluid on the cleaning fluid,
    the means for introducing the drying fluid determining an introduction direction of the drying fluid into the processing vessel and determining an introduction initial speed of the drying fluid so as to expand the drying fluid up to an entire width of the substrates on the fluid face of the cleaning fluid.

9. A device for drying substrates as set forth in claim 8, wherein
    the means for supporting substrates supports the substrates within the processing vessel in an inclined condition at a predetermined angle with respect to a vertical plane, and the nozzle supplies the liquid drops of the drying fluid with the nozzle inclined at an inclination angle same as the predetermined angle of the inclined substrates.

10. A device for drying substrates as set forth in claim 8, further comprising
    means for increasing a supplying quantity of the drying fluid and/or the inert gas into the processing vessel during exhausting of the cleaning fluid from the processing vessel.

11. A device for drying substrates as set forth claim 8, wherein
    the means for supporting substrates includes
    an upper face with a plurality of supporting grooves therein, and
    a cleaning fluid introduction groove which extends from a bottom section of each of the supporting grooves in a downward direction with respect to the upper face.

12. A device for drying substrates as set forth in claim 8, wherein
    the means for supporting substrates is a pair of supporting members for selectively supporting the substrates at different supporting positions, and the device for drying substrates further comprises means for changing the supporting positions of the substrates during exhausting of the cleaning fluid from the processing vessel.

13. A device for drying substrates as set forth in claim 8, further comprising
means for making an interior of the processing vessel an inert gas environment prior to exhausting of the cleaning fluid from the processing vessel.

14. A device for drying substrates as set forth in claim 8, further comprising
means for moving the nozzle towards the substrates during exhausting of the cleaning fluid from the processing vessel.

15. A device for drying substrates as set forth in claim 8, further comprising
means for circulating the drying fluid when the means for introducing the drying fluid is not introducing the drying fluid under a liquid condition within the processing vessel.

16. A device for drying substrates which dries a surface of each of the substrates, the device comprising:

a processing vessel containing a cleaning fluid;
means for supporting substrates within the processing vessel;
means for relatively lowering a fluid face of the cleaning fluid within the processing vessel with respect to the substrates; and
means for introducing a drying fluid under a liquid condition within the processing vessel using a nozzle with the nozzle forming individual liquid drops of the drying fluid and supplying the liquid drops of the drying fluid onto the fluid face of the cleaning fluid,
the nozzle having drying fluid blowing holes a number of which is greater than a number of the substrates by 1, and the substrates being dried simultaneously.

17. A device for drying substrates as set forth in claim 8, further comprising
means for supplying inert gas to the nozzle so as to flow the drying fluid by a pressure of the inert gas.

* * * * *

UNITED STATES PATENT AND TRADEMARK OFFICE
CERTIFICATE OF CORRECTION

PATENT NO.       : 7,377,053 B1
APPLICATION NO.  : 09/936618
DATED            : May 27, 2008
INVENTOR(S)      : Maeda et al.

It is certified that error appears in the above-identified patent and that said Letters Patent is hereby corrected as shown below:

Title Pg. Item [73] Assignee

"[73] Assignee:    Daikin Industries, Ltd., Osaka (JP)"

Should Read:

-- [73] Assignee:   Daikin Industries, Ltd., Osaka (JP);
                    Toho Kasei Ltd., Nara (JP) --

Signed and Sealed this

Twenty-eighth Day of October, 2008

JON W. DUDAS
*Director of the United States Patent and Trademark Office*